United States Patent [19]
Shimizu et al.

[11] Patent Number: 5,397,418
[45] Date of Patent: Mar. 14, 1995

[54] METHOD OF FUSION BONDING OF A MARK PLATE

[75] Inventors: Kenji Shimizu, Tokyo; Atsushi Nobe, Atsugi; Kenichi Yamada, Hiratsuka, all of Japan

[73] Assignee: Nippon Valqua Industries, Ltd., Tokyo, Japan

[21] Appl. No.: 160,190

[22] Filed: Dec. 2, 1993

[30] Foreign Application Priority Data

Dec. 3, 1992 [JP] Japan .................................. 4-324459
Nov. 25, 1993 [JP] Japan .................................. 5-295584

[51] Int. Cl.$^6$ .......................... B32B 31/00; B32B 31/20
[52] U.S. Cl. .................................. 156/293; 156/308.4; 156/311
[58] Field of Search ................. 156/293, 308.4, 311, 156/303.1, 290, 324.4

[56] References Cited

U.S. PATENT DOCUMENTS

| | | | |
|---|---|---|---|
| 3,821,060 | 6/1974 | Braca et al. ............... | 156/303.1 |
| 3,953,932 | 5/1976 | Graves ...................... | 156/303.1 |
| 4,833,306 | 5/1989 | Millbrett .................... | 235/375 |

*Primary Examiner*—Michael W. Ball
*Assistant Examiner*—Richard Crispino
*Attorney, Agent, or Firm*—Wenderoth, Lind & Ponack

[57] ABSTRACT

A method of fusion bonding of a mark plate places a mark plate, having a heat-melt portion formed on at least a part of a front surface-outer peripheral portion, a side surface and a back surface-outer peripheral portion, the heat-melt portion being made of a thermoplastic resin 6, into a recess portion provided on a surface of a wall plate. A peripheral portion of the mark plate is heated to a temperature not lower than the melting point of the thermoplastic resin from the front surface side of the wall plate by a front surface side heater, e.g. a heating platen 7, while heating the peripheral portion of the mark plate to a temperature not higher than the melting point of the wall plate from the back surface side of the wall plate by a back surface side heater, e.g. another heating platen. Due to this Owing to this method, the mark plate can be fused to have a sufficient depth of fused portion within a shorter period of time, the wall plate of the basket body can be prevented from experiencing the occurrence of thermal strain, and the mark plate can be fusion bonded to the wall plate with a sufficient bonding strength.

6 Claims, 6 Drawing Sheets

METHOD OF FUSION BONDING OF A MARK PLATE

FIELD OF THE INVENTION

The present invention relates to an optimum method for fusion bonding of a mark plate having a discrimination mark therein, which is provided, for example, onto an outer peripheral surface of a wafer basket for conveying a large number of semiconductor wafers encased therein.

BACKGROUND OF THE INVENTION

Generally in the processes for preparing IC or LSI, wafer baskets for encasing therein a large number of flat silicon wafers and conveying them are widely used. On the wafer baskets, a discrimination mark indicating a production lot number, a production date, etc. is provided at the request of the process control, and the silicon wafers encased in each wafer basket are individually controlled by reading the discrimination mark.

Accordingly, there have heretofore been proposed wafer baskets of various types, for example, a wafer basket wherein a recording device is provided in the basket body and information is read out by means of the recording device through a display element such as a crystal element as described in Japanese Patent Laid-Open Publication No. 236136/1986, a wafer basket having a ceramic resonance means embedded in the basket body as described in Japanese Patent Laid-Open Publication No. 267338/1986, and a wafer basket having an IC card molded together with the basket body as described in Japanese patent Laid-Open Publication No. 123735/1987.

In those conventional wafer baskets, however, various supplementary equipment is required, and hence it is thought that not only the cost therefor increases, but also the production of those baskets becomes rather difficult because of a restriction of temperatures, etc.

On that account, the present applicant has proposed a basket of another type in Japanese Utility Model Application No. 25889/1990. This basket has a structure such that a mark plate provided with a discrimination mark such as a bar code is fusion bonded onto an outer peripheral surface of the basket body. This basket can be prepared relatively easily and the information for the production control can be easily read out without providing any expensive supplementary equipment.

The basket described in the above Japanese Utility Model Application No. 25889/1990 has the desired effects. However, it has been found that a thermal strain of the basket body is sometimes caused by the heat applied when the mark plate is fusion bonded to the basket body. If the heating time is shortened to prevent occurrence of such heat strain, the depth of the fused portion is made shallow to thereby to lower the bonding strength, resulting in incomplete bonding between the mark plate and the basket body.

OBJECT OF THE INVENTION

It is, therefore, an object of the present invention to provide a method of fusing bonding of a mark plate by which the mark plate can be fused to have a sufficient depth of the fused portion and a wall plate of the basket body can be prevented from experiencing the occurrence of a thermal strain.

SUMMARY OF THE INVENTION

There is provided by the present invention a method of fusion bonding of a mark plate that places the mark plate, having a heat-melt part formed on at least one part of a front surface, outer peripheral portion, a side surface portion and a back surface-outer peripheral portion of said mark plate, the heat-melt portion being made of a thermoplastic resin, into a recess portion provided on a surface of a wall plate. A peripheral portion the mark plate is heated to a temperature of not lower than the melt point of the thermoplastic resin from the front surface side of the wall plate by a front surface side heating means, while heating the peripheral portion of the mark plate to a temperature lower than a melting point of the wall plate from the back surface side of the wall plate by a back surface side heating means.

According to the present invention, the heat-melt portion made of the thermoplastic resin formed on the mark plate is fused by the application of heat from the front surface side of the wall plate so as to bond the peripheral portion of the mark plate to the recess portion of the wall plate and simultaneously, the peripheral portion of the mark plate is heated from the back surface side of the wall plate so as to prevent the applied heat from the front side surface from escaping from the back surface side. Hence, most of the heat applied from the front surface side can be used for fusing (fusion bonding) the thermoplastic resin, and the mark plate can thereby be fusion bonded to the wall plate within a short period of time.

DETAILED DESCRIPTION OF THE INVENTION

The present invention will be described in detail hereinafter with reference to the attached drawings.

Figure 1:
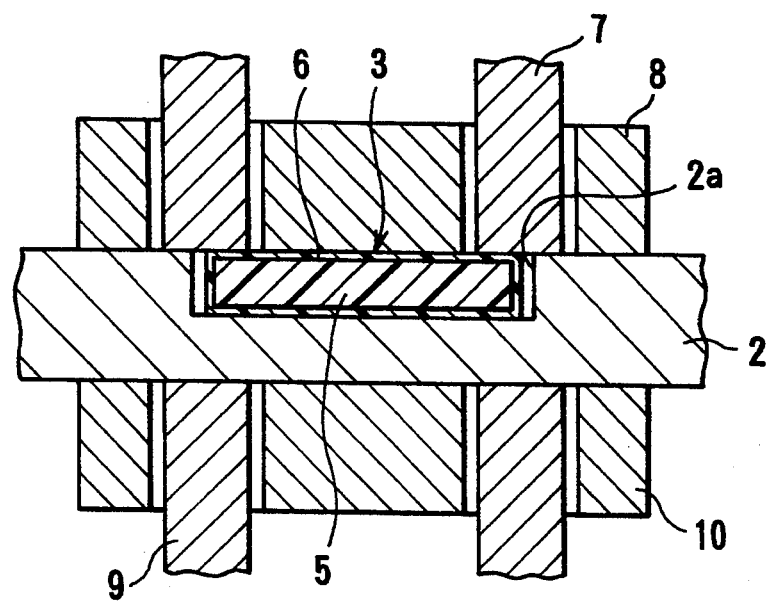
FIG. 1 is an enlarged view of a main part illustrating a first embodiment of the present invention.
Figure 2:
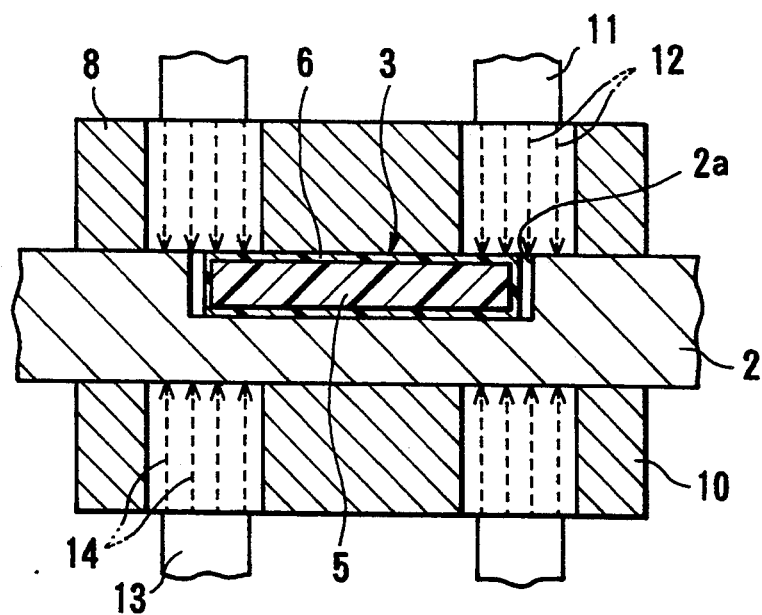
FIG. 2 is an enlarged view of a main part illustrating a second embodiment of the present invention.

FIG. 1 and FIG. 2 are enlarged views of main parts of different embodiments according to the present invention. In each embodiment, a peripheral wall 2 of a basket body 1 of a wafer basket is considered as a wall plate, (also referenced as "2") and a mark plate 3 is fusion bonded to the outer surface of the wall plate 2 (outer peripheral wall of the basket body), as shown in FIG. 3.

Figure 3:
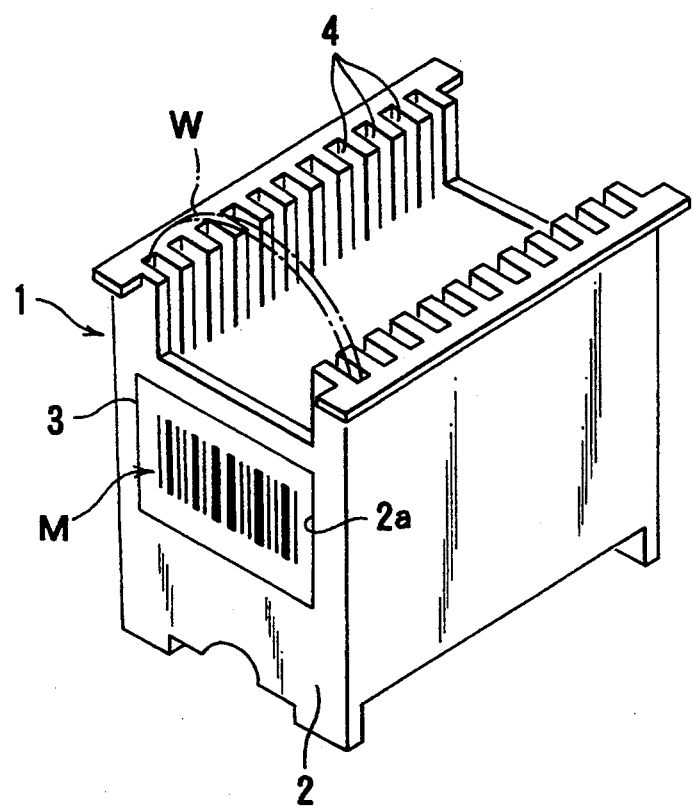
FIG. 3 is a perspective view of a wafer basket to which the present invention is applied.
Figure 4A:
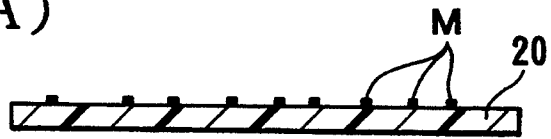
FIGS. 4(A)–4(E) are each an explanatory view of one example of a process for preparing a mark plate used in the present invention.
Figure 4B:
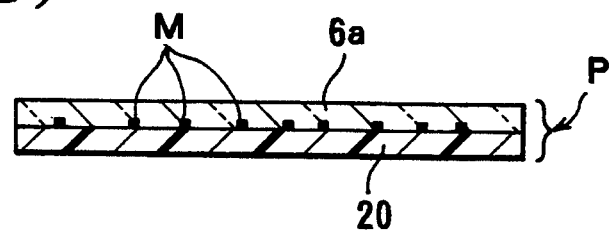
Figure 4C:
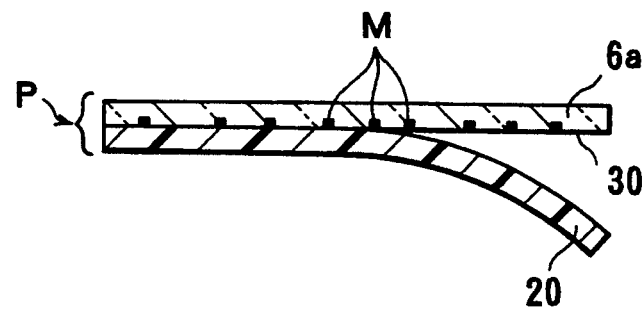
Figure 4D:
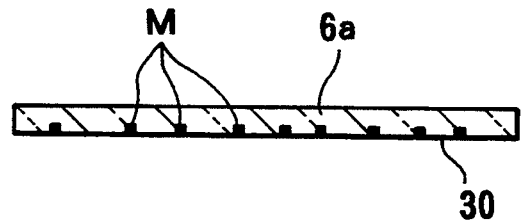
Figure 4E:
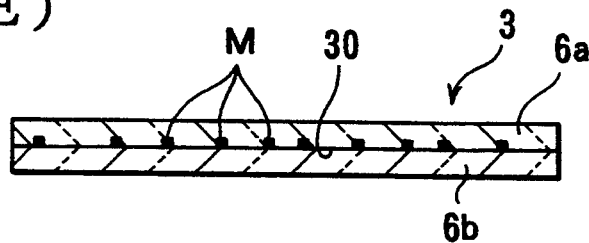

In FIG. 3, the basket body 1 is provided for encasing therein a large number of silicon wafers W in parallel and for conveying wafers: Inside of the basket body 1, a plurality of grooves 4 for receiving the peripheral edges of the silicon wafers and to hold the wafers are formed with given pitches. In order to subject the silicon wafers W successively to chemical treatments while they are encased in the basket body 1, the basket body 1 is formed from a chemical-resistant material, for example, a fluorine resin. On the surface of the wall plate 2 that is a peripheral wall of the basket body 1, a recess portion 2a is formed. The external size of the recess portion 2a is a little larger than the external size of the mark plate 3 which is to be placed into the recess portion 2a. The depth of the concave portion 2a is set to be almost equal to the thickness of the mark plate 3.

As shown in FIGS. 1 and 2, the mark plate 3 is composed of a substrate 5 having a discrimination mark M such as a bar code, on the surface thereof and a thermoplastic resin film 6 of high chemical resistance made of, for example, a fluorine resin, that covers the substrate 5. The part of the thermoplastic film 6 which covers the side surface of the substrate 5 is the a heat-melt portion to be melted by heat to fuse to the wall plate.

Though paper, synthetic resin, metal such as stainless, or ceramic may be used as the material of the substrate 5, a material having excellent chemical resistance, such as polytetrafluoroethylene (PTFE), is preferably used so that the substrate 5 is not corroded with chemicals when the thermoplastic resin film 6 covering the substrate 5 is torn or broken. Depending upon the use conditions, other thermoplastic resins having a relatively high chemical resistance, such as PET (polyethylene terephthalate) and PEEK (polyether ether ketone), and thermosetting resins such as phenol resin and epoxy resin may be used as the material of the substrate 5.

The thermoplastic resin film 6 covers the discrimination mark M, and therefore this film 6 is semitransparent to such an extent that the discrimination mark M is visible from the outside, or wholly or partially transparent.

Preferably employable as the material of the thermoplastic resin film 6 are fluorine resins, such as PTFE, PFA that is a copolymer of tetrafluoroethylene and perfluoroalkyl vinyl ether, FEP that is a copolymer of tetrafluoroethylene and hexafluoropropylene, and EPE that is a copolymer of tetrafluoroethylene, hexafluoropropylene and perfluoroalkyl vinyl ether. Depending upon the use conditions, thermoplastic resins of relatively high chemical resistance other than the fluorine resins, such as PE (polyethylene), PP (polypropylene) and PET, may be used as the material of the thermoplastic resin film 6.

The thermoplastic resin film 6 covering the substrate 5 may have a structure such that the front surface side part and the back surface side part are made of different materials from each other. For example, the front surface side part may be made of PFA. and the back surface side part may be made of PTFE.

With respect to the mark plate in this embodiment, the substrate 5 is covered all over its surface with the thermoplastic resin film 6, and such mark plate is prepared preferably by laminating the thermoplastic resin film 6 on each of the front and back surfaces of the substrate 5 and fusion bonding the periphery of the thermoplastic resin film 6 laminated on the front surface of the substrate and the periphery of the thermoplastic resin film 6 laminated on the back surface of the substrate together. The melting point of the thermoplastic resin film 6 is preferably lower than the melting point of the substrate 5.

The discrimination mark M is formed by applying a colorant onto the surface of the substrate 5. There is no specific limitation on the colorant, and any paints and inks may be used as far as they make a difference in brightness (or darkness) or in shade from the color of the substrate 5. Of various colorants, particularly preferred are carbon type colorants.

Prior to the coating of the substrate 5 with the thermoplastic resin film 6, the substrate 5 provided with the discrimination mark M is preferably heated to remove thermally decomposable organic components contained in the colorant for forming the discrimination Mark M. Through this heat treatment, organic components, such as a wax, a resin component and an organic solvent, contained in the colorant used for forming the discrimination mark M are decomposed and removed. As a result, the discrimination mark M is never discolored, even when the mark plate 3 is heated during the use thereof. The heat treatment of the substrate 5 is carried out at a temperature usually not higher than the melting point of the substrate 5. When the substrate 5 is made of a fluorine resin, for example, PTFE, the heat treatment is preferably carried out at a temperature not lower than 200 ° C., preferably not lower than 250 ° C. and lower than the melting point of PTFE. However, the substrate 5 may be heated at a temperature not lower than the melting point of PTFE if the period of time for the heating is short.

In the present invention, the mark plate 3 is placed into the recess portion 2a formed on the surface of the wall plate 2 that is a peripheral wall of the basket body 1, and then fusion bonded to the wall plate 2. In the embodiment shown in FIG. 1, a heating platen is used as a heating means, and the fusion bonding between the mark plate 3 and the peripheral wall (wall plate 2) is carried out as follows.

After the mark plate 3 is placed into the recess portion 2a, on the front surface side of the wall plate 2, an area spreading from the peripheral portion of the mark plate 3 to the vicinity of the recess portion 2a of the wall plate 2 across the recess portion 2a is contacted with the bottom surface of a heating platen 7 to heat that area, while the circumference of the area heated by the heating platen 7 is cooled by a cooling platen 8. On the other hand, on the back surface side of the wall plate 2, the area opposite to the above-mentioned area heated by the heating platen 7 is contacted with the top surface of a heating platen 9 to heat that area, while the circumference of the area heated by the heating platen 9 is cooled by a cooling platen 10. The wall plate 2 is heated from both the front and back surface sides as described above, and at the same time, a predetermined pressure is applied to the mark plate 3 by means of the heating platen 7 to thermally bond the heat-melt portion formed on the peripheral portion of the mark plate 3 to the recess portion 2a of the wall plate 2 under the pressure. As a, the peripheral portion of the mark plate is fused to the side surface of the recess portion 2a. The temperature of the heating platen 7 is set to be not lower than the melting point of the thermoplastic resin, and the temperature of the heating platen 9 is set to be lower than the resin forming the wall plate 2 so that the wall plate 2 is not fused. The reason why the circumferences of the areas heated by the heating platens 7 and 9, are cooled by the cooling platens 8, and 10 as described above is to prevent the wall plate 2 from experiencing the occurrence of a thermal strain due to the heat given during the thermal bonding stage.

In the above embodiment, the heating is carried out by contacting the heating platen 7 with the mark plate 3 and the wall plate 2. However, it is possible to indirectly heat the thermoplastic resin in a state such a state that the bottom surface of the heating platen 7 is apart from the wall plate 2 and the mark plate 3 and, after the heating, put down the heating platen 7 so as to apply a predetermined pressure to the mark plate 3.

As described above, the wall plate 2 is heated from the front surface side by the heating platen 7 and is simultaneously heated from the back surface side by the heating platen 9, and hence the heat given by the heating platen 7 from the front surface side of the wall plate 2 is prevented from escaping from the back surface side of the wall plate 2. Therefore, most of the heat given by the heating platen 7 from the front surface side of the wall plate 2 can be used for fusing (or fusion bonding) the thermoplastic resin. Accordingly, a sufficient depth of the fused portion can be obtained within a short period of time, and the occurrence of a thermal strain can be inhibited.

In the embodiment, because the heat-melt portion formed in the peripheral portion of the mark plate 3 is fused to the side surface of the recess portion 2a, it is difficult to form a gap between the side surface of the mark plate 3 and the side surface of the recess portion 2a. Accordingly, no liquid chemical is reserved between the side surface of the mark plate 3 and the side surface of the recess portion 2a.

After the mark plate 3 is fusion bonded to the wall plate 2 as described above, the mark plate 3 and the wall plate 2 are cooled, and there is no specific limitation on the cooling method.

For example, a method of slowly cooling the heating platen 7 (front surface side heating means) and the heating platen 9 (back surface side heating means) simultaneously is carried out as follows. The heating platens 7 and 9 are simultaneously cooled at a cooling rate of not more than 60° C./min, preferably not more than 50° C./min, more preferably not more than 30° C./min, particularly not more than 15° C./min, more particularly not more than 10° C./min. While the heating platen 7 and the heating platen 9 are slowly cooled at the same time, it is preferred to apply a pressure to the mark plate 3 with the heating platen 7.

In case the heating platen 7 and the heating platen 9 are simultaneously cooled at a cooling rate of more than 15° C./min, warpage does not occur on the surface of the basket, onto which the mark plate is fused, when the basket is used at a temperature of less than 90° C. However, when the basket is used at a temperature of not less than 90° C., warpage may occurr on the surface of the basket onto which the mark plate is fused, due to the locked-in strain generated during the cooling operation. In case the heating platen 7 and the heating platen 9 are simultaneously cooled at a cooling rate of not more than 15° C./min, it is difficult to generate locked-in strain during the cooling operation. Therefore, even when the basket is used at a temperature of not less than 90° C., warpage hardly occurrs on the surface of the basket onto which the mark plate is fused.

In the cooling operation after fusion bonding the mark plate 3 to the wall plate 2, it is preferred that the heat platen 7 and the heat platen 9 are cooled at the same time after the temperature differential thereof is made to fall within a predetermined range.

As one cooling method as described above, an example is a method of slowly cooling the heating platen 7 (front surface side heating means) to a specific temperature while keeping the temperature of the heating platen 9 (back surface side heating means) constant, and then rapidly cooling the heating platen 7 and the heating platen 9 simultaneously.

In this method, the heating platen 7 is cooled to a temperature ranging from (the temperature of the heating platen 9 −50) °C. to (the temperature of the heating platen 9 +70) °C., and preferably from (the temperature of the heating platen 9 −10) °C. to (the temperature of the heating platen 9 +70) °C. at a cooling rate of not more than 15° C./min, and preferably not more than 8° C./min, while keeping the heating platen 9 at the temperature used in the aforesaid heating stage.

Then, the heating platen 7 is cooled to a temperature not higher than 90° C., and preferably not higher than 50° C., at a cooling rate not more than 60° C./min, preferably not and more than 50° C./min, more preferably not more than 30° C./min, and at the same time, the heating platen 9 is cooled to a temperature not higher than 90° C., and preferably not higher than 50° C., at a cooling rate not more than 60° C./min, preferably not more than 50° C./min, and more preferably not more than 30° C./min. It is desired that the cooling rate of the heating platen 7 be almost equal to that of the heating platen 9.

According to the above-described cooling method after the fusion bonding of the mark plate to the wall plate (peripheral wall of the basket body), wherein the heating platen 7 is slowly cooled to a specific temperature while keeping the temperature of the heating platen 9 constant, and then the heating platens 7 and 9, are rapidly cooled at the same time, there can be produced a wafer basket attached with a mark plate which is hardly warped even after it is used at high temperature. For example, the wafer basket with a mark plate thus produced has no distortion or no dimensional change even after being used at a temperature of about 180 ° C. The cooling method is preferably used particularly because a wafer basket with a mark plate can be produced within a short period of time.

After the cooling process as described above, it is preferable to heat the wafer basket to a temperature higher than the temperature at which the wafer basket is used, because the locked-in strain can be removed and, therefore there can be obtained a wafer basket in which the warpage of the wall plate 2 is more hardly occurred even after being used at high temperature.

FIG. 2 shows another embodiment according to the present invention. In this embodiment, hot air is used as the heating means. In the embodiment shown in FIG. 2, on the front surface side of the wall plate 2, an area spreading from the peripheral portion of the mark plate 3 to the vicinity of the recess portion 2a of the wall plate 2 across the recess portion 2a is heated by hot air 12 blown out from a hot air tube 11. At the same time, on the back surface side of the wall plate 2, the area opposite and corresponding to the above-mentioned area heated by the hot air 12 is heated by hot air 14 blown out from a hot air tube 13. Thus, both the areas on the front and back surface sides of the wall plate 2 are simultaneously heated, and a predetermined pressure is also applied to the mark plate to thermally bond the mark plate to the wall plate under the pressure. This method also provides effects similar to those of the aforementioned method.

The present invention has been described hereinbefore with reference to FIGS. 1, 2 and 3, but the invention is in no way limited to the embodiments shown in those figures. For example, though the mark plate 3 in which the whole surface of the substrate 5 is coated with the thermoplastic resin film 6 is used in the above embodiments, the mark plate may have a structure such that a discrimination mark M is encapsulated with (i.e., sandwiched between) thermoplastic resin films 6a and 6b laminated one upon another, as shown in FIG. 4 (E), In this mark plate 3, the peripheral portion of the mark plate 3 is the heat-melt portion, and the heat-melt portion is fused to the side surface of the recess portion 2a. In the embodiment, for the same reason as described about the mark plate shown in FIGS. 1 and 2, the heat-melt portion formed on the peripheral portion of the mark plate 3 is fused onto the side surface of the recess portion 2, and therefore, a gap is difficult to be formed between the side surface of the mark plate 3 and the side surface of the recess portion 2a. Accordingly, no liquid chemical will be reserved between the side surface of the mark plate 3 and the side surface of the recess portion 2a in case of chemical treatment.

Further, the mark plate may be composed of a substrate 15 with a discrimination mark thereon, and a thermoplastic film 16 covering all of the front surface of the substrate 15, of which a peripheral portion projects outwardly from the side surface of the substrate 15.

Figure 6:
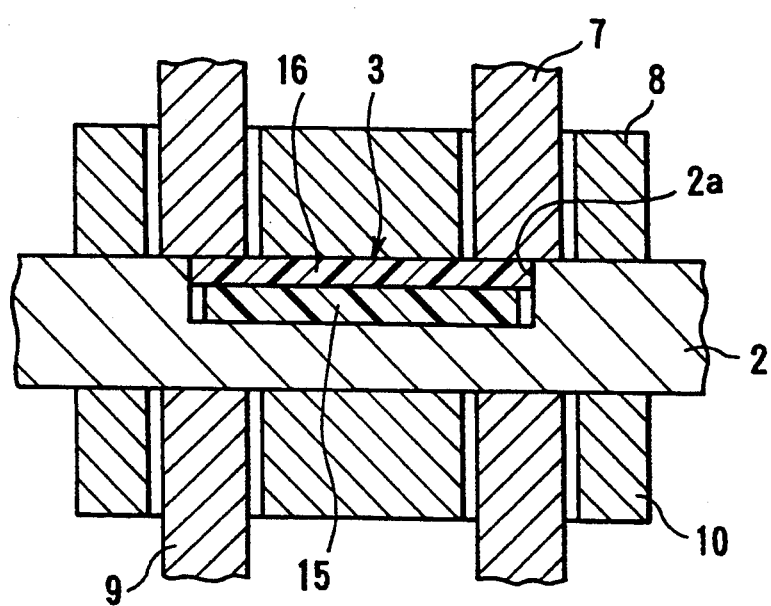
FIG. 6 is an enlarged view of a main part illustrating an embodiment of a mark plate applicable for the present invention.

FIG. 6 shows a state wherein the mark plate 3 is placed in a recess portion 2a formed on a surface of a wall plate 2, that is, a peripheral wall of the basket body. In FIGS. 1, 2 and 6, the same parts are indicated by the same reference number. The mark plate 3 shown in FIG. 6 can be fusion bonded to the wall plate 2 by the same manner as described in the other embodiments.

In this embodiment, because the heat-melt portion is the peripheral portion of the mark plate 3 and fused to the side surface of the recess portion 2a, a gap is difficult to be formed between the side surface of the mark plate 3 and the side surface of the recess portion. Accordingly, no liquid chemical is reserved between the side surface of the mark plate 3 and the side surface of the recess portion 2a in case of chemical treatment.

The mark plate in which the discrimination mark is encapsulated is prepared by through the steps shown in FIGS. 4 (A) to 4 (D). The steps for preparing the mark plate are described below with reference to FIGS. 4 (A) to 4 (D).

First, the discrimination mark M is attached to a transfer sheet 20 by means of printing or the like, as shown in FIG. 4 (A). Then, the transfer sheet 20 with the discrimination mark M is brought into close contact with a thermoplastic resin film 6a, that is, the thermoplastic resin film 6a is laminated on the transfer sheet 20 with the discrimination mark M to obtain a laminate P consisting of the transfer sheet 20 and the thermoplastic resin film 6a, as shown in FIG. 4 (B). The laminate P thus obtained is heated at a temperature not lower than the melting point of the thermoplastic resin film 6a and lower than the melting point of the transfer sheet 20, whereby the discrimination mark M, having been attached to the transfer sheet 20, is transferred to a surface 30 of the thermoplastic resin film 6a. The material of the transfer sheet 20 is, for example, uncalcined PTFE; and the material of the thermoplastic resin film 6a is, for example, the same material as for the aforesaid thermoplastic resin film 6, such as PFA.

In this stage, the laminate P of the transfer sheet 20 and the thermoplastic resin film 6a is heated at a temperature lower than the melting point of the transfer sheet 20, so that the transfer sheet 20 and the thermoplastic resin film 6a are never fusion bonded to each other, and the discrimination mark M transferred to the surface 30 of the thermoplastic resin film 6a is hardly deteriorated.

After cooling of the laminate P, the transfer sheet 20 is peeled and removed from the laminate P, as shown in FIG. 4 (C), to obtain the thermoplastic resin film 6a having the discrimination mark M on its surface 30 as shown in FIG. 4 (D). The thermoplastic resin film 6a having the discrimination mark M on its surface 30 may be heated to remove thermally decomposable organic components contained in the material of the discrimination mark M, as stated before.

Subsequently, as shown in FIG. 4 (E), the thermoplastic resin film 6a having the discrimination mark M on its surface 30 is brought into close contact with a thermoplastic resin film 6b made of a similar resin to that of the thermoplastic resin film 6a, and they are then heated at a temperature not lower than the melting point of the thermoplastic resin films 6a and 6b and preferably a temperature higher by about 10° to 50 ° C. than the melting point of the thermoplastic resin films 6a and 6b, to fusion bond the thermoplastic resin films 6a and 6b together. This is followed by cooling the fused films.

By fusion bonding the thermoplastic resin films 6a and 6b together so that the discrimination mark M is sandwiched between the thermoplastic resin films 6a and 6b as described above, there can be obtained a mark plate 3 with the discrimination mark M encapsulated with the thermoplastic resin films laminated one upon another.

Figure 5A:
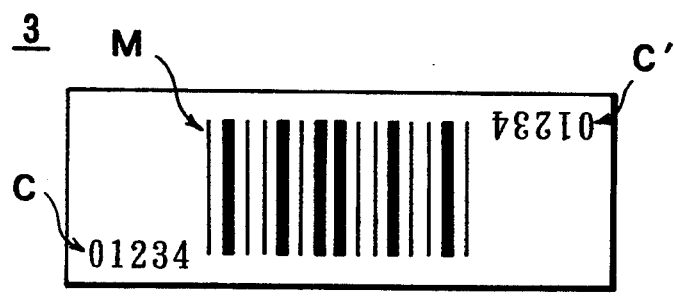
FIGS. 5(B)–(C) are schematic views showing some examples of a mark plate used in the present invention.
Figure 5B:
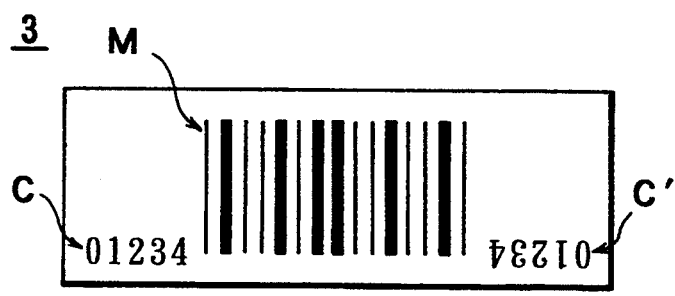
Figure 5C:
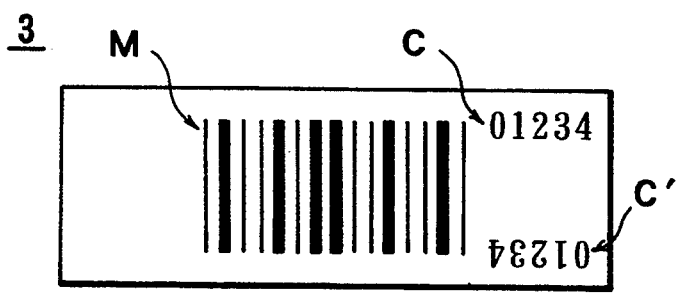

In the method of the present invention, there is no specific limitation on the kind, formation, etc. of the discrimination symbol or the discrimination mark attached onto the mark plate. Accordingly, the mark plate 3 may have thereon only a discrimination mark M to be detected by an optical reading device as shown in FIG. 3. Otherwise, the mark plate 3 may have discrimination letters C, C' for visual discrimination other than the discrimination mark M, as shown in FIGS. 5. The discrimination letters C, C' may each be composed of one letter or a combination of letters. Further, the same discrimination letters may be placed at two or more different positions on the mark plate 3. When the same discrimination letters are placed at two or more different positions, at least one discrimination letter C' and another discrimination letter C are preferably placed in such a manner that they are reversed in the top and bottom and in the right and left. In this case, the two discrimination letters C, C' are each preferably placed in the vicinity of the opposite angle of the mark plate 3 as shown in FIG. 5 (A), in the vicinity of the same side of the mark plate 3 as shown in FIG. 5 (B), or in the vicinity of the opposite side of the mark plate 3 as shown in FIG. 5 (C). Further, plural sets of discrimination letters, each set consisting of discrimination letters which are reversed in the top and bottom and in the right and left, may be attached onto the mark plate 3.

EFFECT OF THE INVENTION

According to the method of fusion bonding of a mark plate in the present invention, the heat applied from the front surface side of the wall plate is prevented from escaping from the back surface side of the wall plate, whereby most of the heat applied from the front surface side can be used for fusing (fusion bonding) the thermoplastic resin film. Accordingly, a sufficient depth of the fused portion can be obtained within a short period of time, and the wall plate can be prevented from experiencing the occurrence of thermal strain. Further, the mark plate can be fusion bonded to the wall plate with a sufficient bonding strength.

EXAMPLE

The present invention will be further described with reference to examples, but it should be construed that the invention is in no way limited to those examples.

Example 1

A mark plate 3 as shown in FIG. 1 was fusion bonded on the wall plate 2 by using the Fusion bonding machine shown in FIG. 1. Namely, the mark plate 3, laminated with PFA, was fusion bonded to the wall plate 2 made of PFA, having a melting point of 305 ° C. The thickness of the wall plate 2 was 4 mm. The thickness of the mark plate 3 and the depth of the recess portion 2a were each 2.2 mm.

The temperature of the heating platen 7 for heating the front surface side of the wall plate 2 was set to 355° C., the temperature being higher than the melting point of PFA; the temperature of the heating platen 9 for heating the back surface side of the wall plate 2 was set to 290° C., the temperature being lower than the melting point of PFA; the temperature of a cooling platen was set to 25 ° C.; and the pressure was set to 0.125 kg/cm$^2$. Under these conditions, heating for the fusion bonding was carried out for 5 minutes. The results are set forth in Table 1.

The bonding strength between the mark plate and the wall plate was measured by cutting a laminate sample consisting of the mark plate and the wall plate into a specimen (in which one terminal end of a piece cut from the plate wall is fused to a terminal end of a piece cut from the mark plate) having a width of 1 cm and peeling one piece from the other by pulling at the free terminal ends of the pieces in the direction of 180° at a peel rate of 50 mm/min. The depth of the fused portion was measured by cutting the sample and observing its section.

Comparative Example 1

The mark plate 3 was fusion bonded to the wall plate 2 in the same manner as described in Example 1 except for not conducting the heating from the back surface side of the wall plate 2. The results are set forth in Table 1.

TABLE 1

|  | Bonding Strength (kg/cm) | | Depth of Fused Portion (mm) | |
| --- | --- | --- | --- | --- |
|  | Ex. 1 | Comp. Ex. 1 | Ex. 1 | Comp. Ex. 1 |
| 1st time | 13.4 | 9.7 | 1.6 | 1.0 |
| 2nd time | 12.0 | 8.9 | 1.7 | 1.2 |
| 3rd time | 13.5 | 8.7 | 1.5 | 0.9 |
| Average | 13.0 | 9.1 | 1.6 | 1.0 |

As is evident from the results set forth in Table 1, in Example 1, according to the present invention, the bonding strength and the depth of the fused portion both larger than those obtained in Comparative Example 1 (conventional process) can be obtained at the same heating time. Accordingly, the bonding strength and the depth of the fused portion equal to those of the conventional method can be obtained by the process of the invention within a shorter period of time than that for the conventional process. As a result, the heating time of the wall plate 2 can be shortened, and thereby the wall plate 2 can be effectively prevented from experiencing the occurrence of a thermal strain caused by the heat given by the thermal bonding under pressure.

Example 2

A mark plate 3 as shown in FIG. 1 was fusion bonded on the wall plate 2 by using the bonding machine as shown in FIG. 1. Namely, the mark plate 3 laminated with PFA was fusion bonded to the wall plate 2 made of PFA having a melting point of 305 ° C. The thickness of the wall plate 2 was 4 mm. The thickness of the mark plate 3 and the depth of the recess portion 2a were each 2.0 mm.

The temperature of the heating platen 7 for heating the front surface side of the wall plate 2 was set to 370° C., to temperature being higher than the melting point of PFA; the temperature of the heating platen 9 for heating the back surface side of the wall plate 2 was set to 287° C., the temperature being lower than the melting point of PFA; the temperature of a cooling platen was set to 25 ° C.; and the pressure was set to 0.125 kg/cm$^2$. Under these conditions, heating for the fusion bonding was carried out for 5 minutes. Thereafter, while keeping the temperature of the heating platen 9 at 287 ° C., the heating platen 7 was cooled to a predetermined temperature at a cooling rate of 8° C./min, and then the heating platen 7 and the heating platen 9 were simultaneously cooled at a cooling rate of 50° C./min.

Subsequently, the wall plate 2 thus fusion bonded with the mark plate 3 was heated to 180 ° C., and a size (w) of warpage which occurred on the wall plate by the heating was measured. The results are set forth in Table 2.

Figure 7:
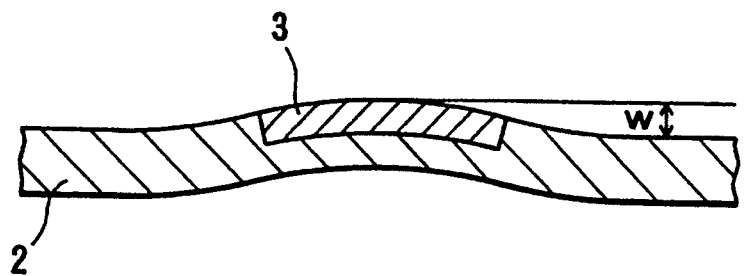
FIG. 7 is a side view showing outward warpage, inward warpage and the size of each warpage.
Figure 7:
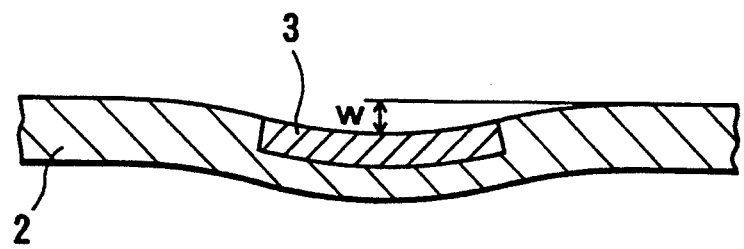

The warpage includes outward warpage and inward warpage, and the size of the outward warpage or the inward warpage is indicated by a symbol w in FIG. 7.

TABLE 2

|  | Temperature* (°C.) | Size of Warpage (mm) |
| --- | --- | --- |
| Example 2 | 266 | 2.7 (inward warpage) |
|  | 295 | 1.4 (inward warpage) |
|  | 303 | 1.5 (inward warpage) |
|  | 331 | 0.8 (inward warpage) |
|  | 370 | 1.0 (outward warpage) |

Temperature*: surface temperature of the heating platen 7 at the time when rapid cooling was started.

Example 3

The mark plate 3 was fusion bonded to the wall plate 2 in the same manner as described in Example 2, except for using a wall plate 2 having a thickness of 5 mm. The size of the warpage which occurred on the wall plate 2, fusion bonded with the mark plate 3, was measured. The results are set forth in Table 3.

TABLE 3

|  | Temperature* (°C.) | Size of Warpage (mm) |
| --- | --- | --- |
| Example 3 | 295 | 1.3 (inward warpage) |
|  | 315 | 1.2 (inward warpage) |
|  | 330 | 0.7 (inward warpage) |
|  | 350 | 0.8 (outward warpage) |
|  | 370 | 1.0 (outward warpage) |

Temperature*: surface temperature of heating platen 7 at the time when the rapid cooling was started.

What is claimed is:

1. A method of fusion bonding a mark plate to a wall plate, comprising the steps of:

placing a mark plate into a recess provided on a surface of a wall plate, the mark plate comprising a front surface, a side surface and a back surface, each of the front and back surfaces having outer peripheral portions, and the mark plate further comprising a heat-melt portion formed on at least one of the outer peripheral portion of the front surface, the side surface and the outer peripheral portion of the back surface, the heat-melt portion comprising a thermoplastic resin, and the wall plate having a front surface and a back surface and comprising a resin; and heating the heat-melt portion of the mark plate and the wall plate in an area in the vicinity of the recess to a temperature not lower than the melting point temperature of the thermoplastic resin of the heat-melt portion and not lower than the melting point temperature of the resin of the wall plate from the front surface side of the wall plate with a front surface side heater, while heating an area of the back surface of the wall plate opposite to the area being heated by the front surface side heater to a temperature lower than the melting point of the resin of the wall plate from the back surface side of the wall plate with a back surface side heater.

2. The method of claim 1, and further comprising, after said step of heating, the steps of:

cooling the front surface side heater to a temperature ranging from a temperature of the back surface side heater before said step of cooling minus 50° C. to the temperature of the back surface side heater before said step of cooling plus 70° C. at a cooling rate of no more than 15° C./minute while maintaining the temperature of the back surface side heater constant if a temperature of the front surface side heater before said step of cooling is higher than the temperature of the back surface side heater; and then simultaneously cooling both said front surface side heater and said back surface side heater at a cooling rate no more than 60° C./minute.

3. The method of claim 1, and further comprising the step of:

during said step of heating, cooling an area on the front surface of the wall plate around the area in the vicinity of the recess with a front surface cooling platen and cooling an area around the area of the back surface of the wall plate opposite the area in the vicinity of the recess with a back surface cooling platen.

4. The method of claim 1, wherein said step of heating comprises the front surface side heater being a heating platen pressed against the mark plate with a predetermined pressure during heating.

5. The method of claim 1, wherein said step of heating comprises the front surface side heater being a heating platen pressed against the mark plate with a predetermined pressure after indirectly heating the area in the vicinity of the recess.

6. The method of claim 1, wherein said step of heating comprises the front surface side heater and the back surface side heater being hot air tubes blowing hot air.

* * * * *